(12) United States Patent
Kovarik

(10) Patent No.: US 7,282,818 B2
(45) Date of Patent: Oct. 16, 2007

(54) POWER HAND TOOL HAVING A PROXIMITY DETECTOR

(75) Inventor: Illya Kovarik, Chicago, IL (US)

(73) Assignee: Credo Technology Corporation, Broadview, IL (US)

( * ) Notice: Subject to any disclaimer, the term of this patent is extended or adjusted under 35 U.S.C. 154(b) by 623 days.

(21) Appl. No.: 10/395,194

(22) Filed: Mar. 25, 2003

(65) Prior Publication Data

US 2003/0202851 A1  Oct. 30, 2003

Related U.S. Application Data

(63) Continuation-in-part of application No. 10/119,662, filed on Apr. 10, 2002.

(51) Int. Cl.
| | | |
|---|---|---|
| H01H 35/00 | (2006.01) | |
| F21V 23/04 | (2006.01) | |
| H03K 17/955 | (2006.01) | |

(52) U.S. Cl. .................................... 307/117; 307/326
(58) Field of Classification Search ................ 307/326, 307/328, 117; 408/8; 173/2
See application file for complete search history.

(56) References Cited

U.S. PATENT DOCUMENTS

| | | | | |
|---|---|---|---|---|
| 4,312,332 A | * | 1/1982 | Zick | ............................ 600/358 |
| 4,381,037 A | | 4/1983 | Cuneo | |
| 4,410,846 A | | 10/1983 | Gerber et al. | |
| 4,488,370 A | | 12/1984 | Lemelson | |
| 4,604,005 A | | 8/1986 | Russ | |
| 4,942,313 A | * | 7/1990 | Kinzel | ........................ 307/326 |
| 5,014,793 A | * | 5/1991 | Germanton et al. | ........ 173/181 |
| 5,169,225 A | * | 12/1992 | Palm | .......................... 362/118 |
| 5,340,972 A | | 8/1994 | Sandor | |
| 5,576,531 A | | 11/1996 | Murphy | |
| 5,583,386 A | * | 12/1996 | Meixner et al. | ............. 307/326 |
| 5,831,261 A | | 11/1998 | Plesko | |
| 5,933,288 A | | 8/1999 | Plesko | |
| 5,973,318 A | | 10/1999 | Plesko | |
| 6,057,554 A | | 5/2000 | Plesko | |
| 6,202,930 B1 | | 3/2001 | Plesko | |
| 6,250,601 B1 | | 6/2001 | Kolar et al. | |
| 6,262,712 B1 | * | 7/2001 | Osborne et al. | ............. 345/156 |
| 6,380,930 B1 | * | 4/2002 | Van Ruymbeke | ........... 345/173 |
| 6,443,675 B1 | * | 9/2002 | Kopras et al. | .............. 409/182 |
| 6,517,295 B2 | | 2/2003 | Lin | |
| 2003/0133239 A1 | * | 7/2003 | Feil | ............................. 361/72 |
| 2003/0194283 A1 | * | 10/2003 | Kovarik et al. | ................. 408/4 |

FOREIGN PATENT DOCUMENTS

| | | | |
|---|---|---|---|
| JP | 2002205285 A | * | 7/2002 |
| JP | 2002210678 A | * | 7/2002 |

OTHER PUBLICATIONS

English translation for JP2002-205285 A Sakabe et al.*
QProx QT118H Charge-Transfer Touch Sensor brochure, Quantum Research Group, 1999-2000.

* cited by examiner

*Primary Examiner*—Michael Sherry
*Assistant Examiner*—Andrew M. Deschere
(74) *Attorney, Agent, or Firm*—Greer, Burns & Crain, Ltd

(57) ABSTRACT

The present invention provides a power tool with a hand proximity detector to detect the hand of an operator and a trigger circuit operable with the detector to control the operation of a light in the housing or to provide a safety lockout function. One embodiment includes an operating mode indicating light that is responsive to the detector.

14 Claims, 6 Drawing Sheets

POWER HAND TOOL HAVING A PROXIMITY DETECTOR

This is a continuation-in-part of application Ser. No. 10/119,662, filed Apr. 10, 2002 and having the same title as indicated above.

BACKGROUND OF THE INVENTION

This invention relates to power hand tools, and more specifically, to power hand tools that have a proximity detector that detects when an operator is in position to operate the tool and automatically illuminates a light or provides a safety function.

Power tools including relatively small portable handheld power tools are commonly used in a wide variety of locations and lighting conditions, including those where the available light may be poor for a variety of reasons. It is common to use a work light or a flashlight in such situations. However, it is often inconvenient to hold the light in the correct position at the same time one is using the hand tool. If there is no place to clamp or hang a light, the operator of the tool must then hold the tool and the light steady while attempting to utilize the tool. This is particularly inconvenient if the operator is on a ladder or in a situation where one of his/her hands is needed for another purpose.

SUMMARY OF THE INVENTION

The present invention is directed to a power hand tool with an automatic hand proximity detector that preferably senses the presence of the hand and turns on a light to illuminate the work piece. The proximity detector can also be used as a safety interlock for de-energizing a portable power tool of the type which uses an on-off switch to activate it, such as a router, for example.

Another embodiment of the present invention also provides a visual indication of the direction of rotation of the hand tool when the proximity detector senses the presence of a hand.

DETAILED DESCRIPTION OF THE DRAWINGS

DETAILED DESCRIPTION OF THE INVENTION

The preferred embodiment of the present invention is a portable power hand tool with a proximity detector disposed in the housing to sense the hand of an operator and turn on a light, preferably a light emitting diode, that is also disposed in the housing. A trigger circuit is located within the housing and is connected to the detector, the light and a power source. The trigger circuit also includes a switch for connecting the power source to the light when the detector detects the presence of the user's hand.

Figure 1:
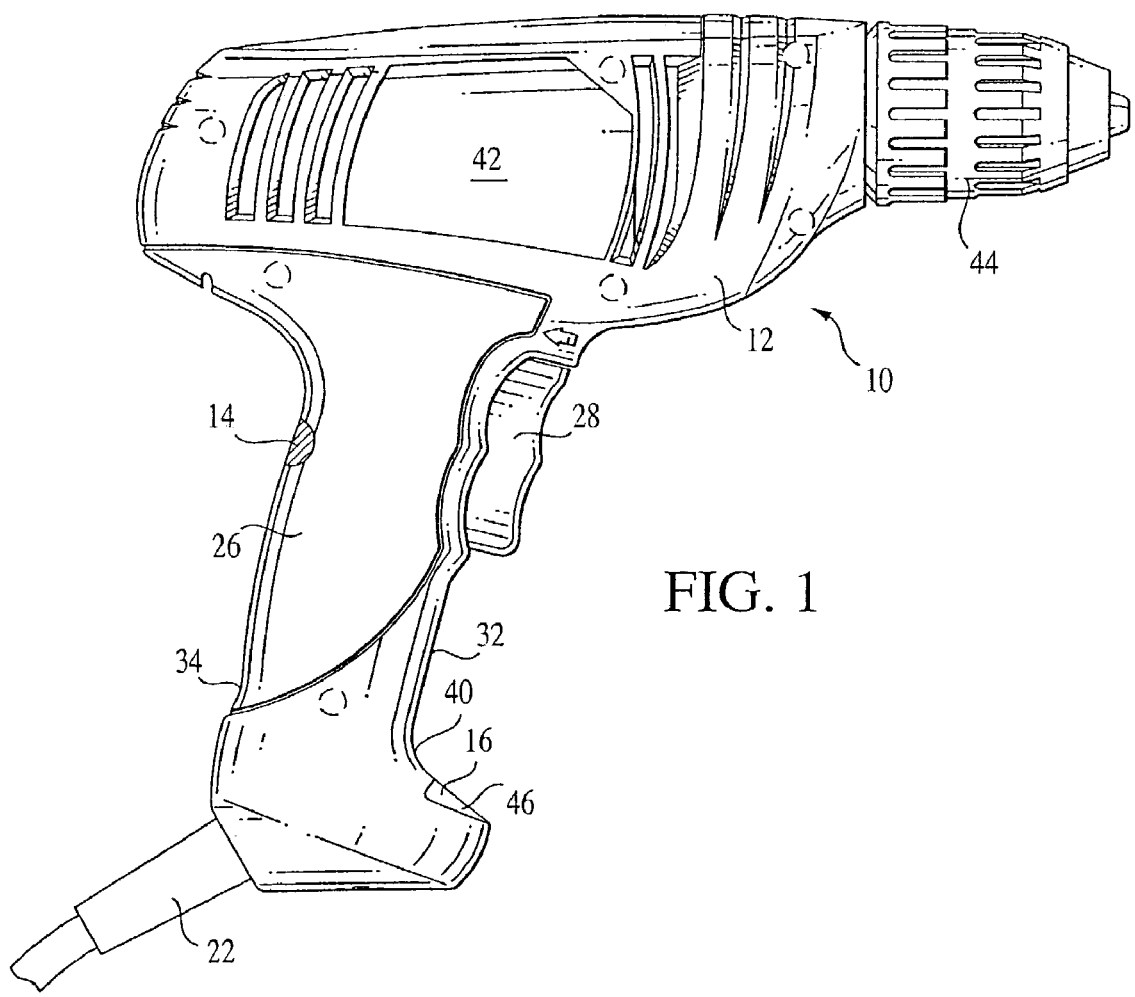
FIG. 1 is a side plan view of a tool embodiment of the present invention.
Figure 2:
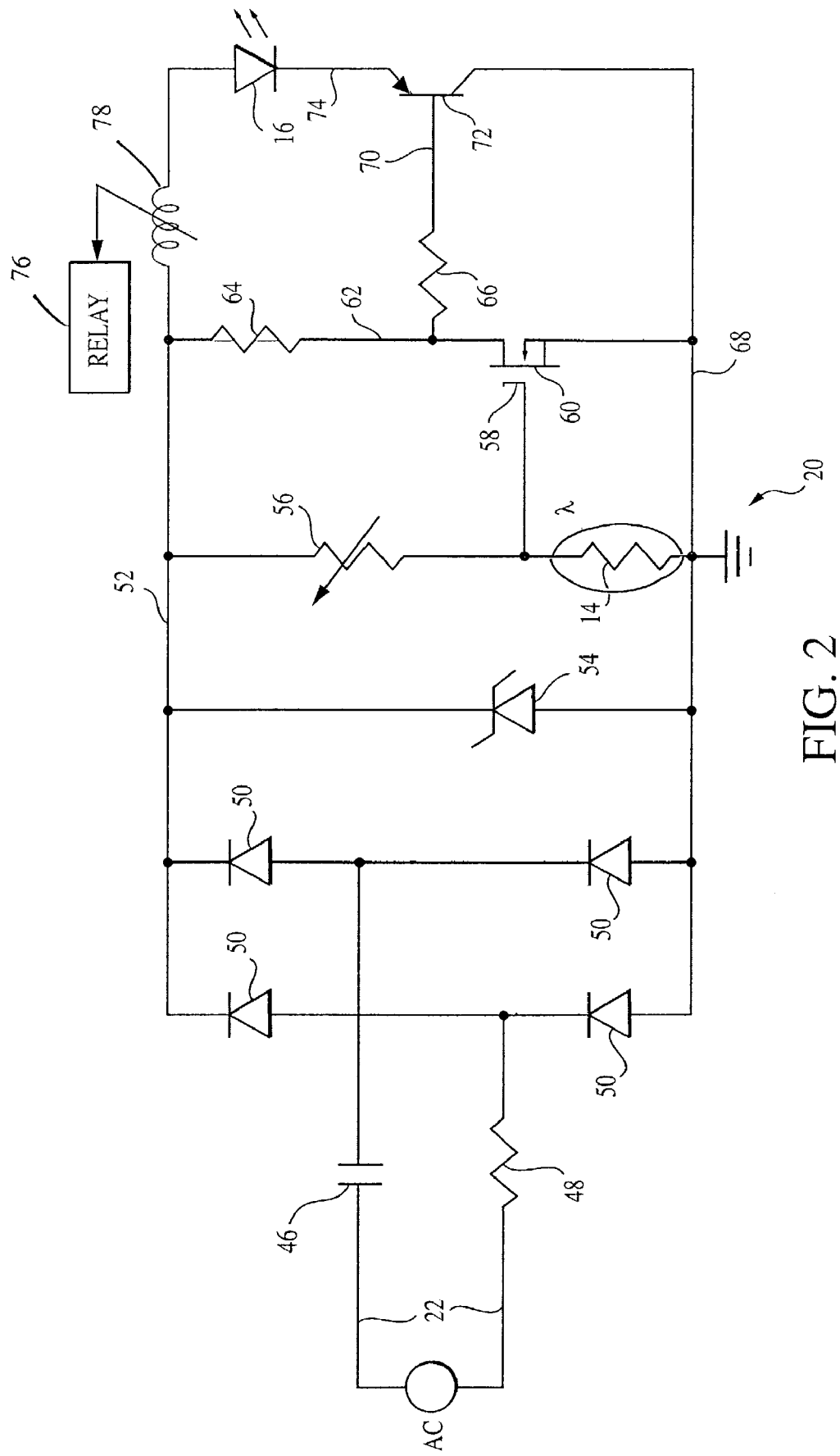
FIG. 2 is a schematic diagram of a trigger circuit for the tool of FIG. 1.

Turning now to the drawings and referring to FIG. 1, a hand-operated power drill, designated generally 10, is illustrated, but many other power hand tools are suitable for use with this invention, such as circular saws, screwdrivers, routers, and the like. The drill includes a housing 12 having a detector 14 and a light 16 disposed therein. A trigger circuit, designated generally at 20 in FIG. 2, is located within the housing and is connected to the detector 14, the light 16 and an AC power source via lines 22. When the operator picks up the drill 10 to use it in a normal manner, the detector 14 senses the user's hand causing the circuit 20 to turn on the light 16 and illuminate the work area. After normal use, when the operator sets down the drill 10 and removes his hand, the electrical response of the detector 14 causes the circuit 20 to cut off power to the light 16.

Many types of detectors 14 capable of sensing the proximity of the operator's hand can be used with the present invention. Preferred detectors 14 include a photocell or an infrared sensor, although a capacitance detector of the type which detects a change in frequency of a base signal due to the proximity of one's hand can be used. Alternatively, any detector that senses an inherent property of one's hand, such as its heat, resistance, capacitance, ability to block light, reflectance, magnetic properties and the like are within the spirit and scope of the present invention. Most preferably, consistent operation of the detector 14 should not depend on the use of work gloves or other coverings to protect the hand.

The detector 14 is located in the housing 12 and positioned to sense the user's hand during the normal operation of the drill 10. Generally, when the user grips a drill, the hand is wrapped around a handle portion 26, with the palm positioned against a side of the handle 26 and one or two fingers on a trigger 28 that controls the drill speed. The remaining fingers generally wrap around the front 32 of the handle 26, while the thumb and thumb pad wrap around the back 34 of the handle for stability. The preferred location for the detector 14 is in an area of the handle 26 that is covered by the hand of either a right or a left-handed user. Most preferably, the detector 14 is located on the front 32 of the handle 26, below the trigger 28, where the ring finger and the small finger wrap around the front 32 of the handle 26, or at the back 34 of the handle opposite the trigger, where the palm or the hand or the thumb pad wrap around the back 34 of the handle 26.

The light 16 is also disposed in the housing 12. Any type of small lamp 16 of a size suitable for use on the housing 12, including flashlight bulbs may be used in this invention, but the lights 16 are preferably light emitting diodes ("LEDs") due to their long life, small size and low power usage. In this regard, one or more high-intensity, white LEDs 16 are especially suitable for use with this invention as they produce large amounts of light. In the embodiment of FIG. 1, the light 16 is located in a lower portion 40 of the handle 26, but it may be located elsewhere on the housing 12 provided that it is capable of illuminating the workpiece. A lens 46 may be provided to concentrate the light in the vicinity of the work piece and/or to provide an esthetically pleasing appearance and also to provide protection for the LED.

Referring now to FIG. 2, the trigger circuit 20 controls the operation of the light 16 in response to the electrical signal from the detector 14 and is located within the housing 12, preferably in the handle 26 of the drill 10. The circuit is preferably powered from an AC power source via the cord 22, although it could be modified to be powered from a DC source such as an internal battery.

The characteristics of the electrical circuit change depend on the kind of the detector 14 that is employed. If the detector 14 is a photocell, resistance of the photocell 14 changes as it receives various amounts of light. Its resistance is high when the photocell 14 detects a dark condition (i.e., the presence of a hand over the detector), inhibiting flow of electricity through that portion of the circuit 20. However, when exposed to light, its resistance drops, which increases current flow.

The trigger circuit 20 electrically connects the detector 14, the light 16 and the power source to control power to the light 16 in response to the operation of the detector 14. The AC source is connected by line 22 to a capacitor 46 and a first resistor 48 which are in turn connected to an AC to DC converting rectifier bridge comprising four diodes 50 in circuit. The capacitor 46 acts as a large AC resistance and the resistor 48 limits the initial current applied to the capacitor 46 and thereby protects the remaining circuitry from any power surges, including any initial power surge experienced when the drill 10 is first connected to the AC power source.

Since the circuit 20 operates in a constant current mode and preferably should not exceed a maximum voltage, the output of the bridge appears on line 52 and it is connected to a Zener diode 54 which reversibly breaks down when the voltage on line 52 exceeds a predetermined level. This occurs when the photocell 14 has a low resistance when it detects a bright light condition and the light 16 is turned off, thereby not using any current. When the photocell 14 detects a dark condition or hand being present, and results in the light 16 being illuminated by operation of the circuit 20, thereby drawing current, and the voltage applied to the Zener diode 54 drops below the breakdown value, and the Zener diode 54 stops current flow through it. The total constant current is in this manner shared between the light 16 and the Zener diode 54. The exact breakdown value of the Zener diode 54 is chosen depending on the type and voltage of the light 16 and other circuit considerations known to those of ordinary skill in the art. For a white LED 16, the Zener diode 54 is preferably of the common 5.1 volts breakdown type.

The trigger circuit 20 includes a variable resistor 56, which with the detector 14 creates a voltage divider to a gate 58 of a switching transistor 60. The transistor 60 is connected to line 62 that is connected to a resistors 64 and 66 and also to ground 68. The resistor 66 is connected to base 70 of a switching transistor 72 the emitter 74 of which is connected to the light and the collector of which is connected to ground 68. When the photocell 14 detects a bright light condition, its resistance is low and the transistor 60 is switched off which keeps the transistor 72 also in a non-conducting state. When the photocell detects a dark condition, the transistor 60 is switched on, which in turn causes the base of transistor 72 to go to a low voltage and place the transistor 72 into conduction which activates the light 16. Thus, the circuit 20 provides power from the power source to the light 16 when the detector 14 detects the presence of the operator's hand.

With regard to the circuit components, it has been found that a MOSFET transistor is suitable for transistor 60, with its drain 62 controlling the base 70 of a bipolar junction transistor 72. When the second conventional PNP transistor 72 is used, the light 16 tends to have a sharper transition between "on" and "off." Although this may be desirable in some circumstances, the use of the second bipolar transistor 72 in the circuit may be considered optional. It should be understood that the MOSFET 60 may be replaced by another type of electronic triggering component, such as a comparator, and is considered to be within the scope of the present invention.

Figure 3:
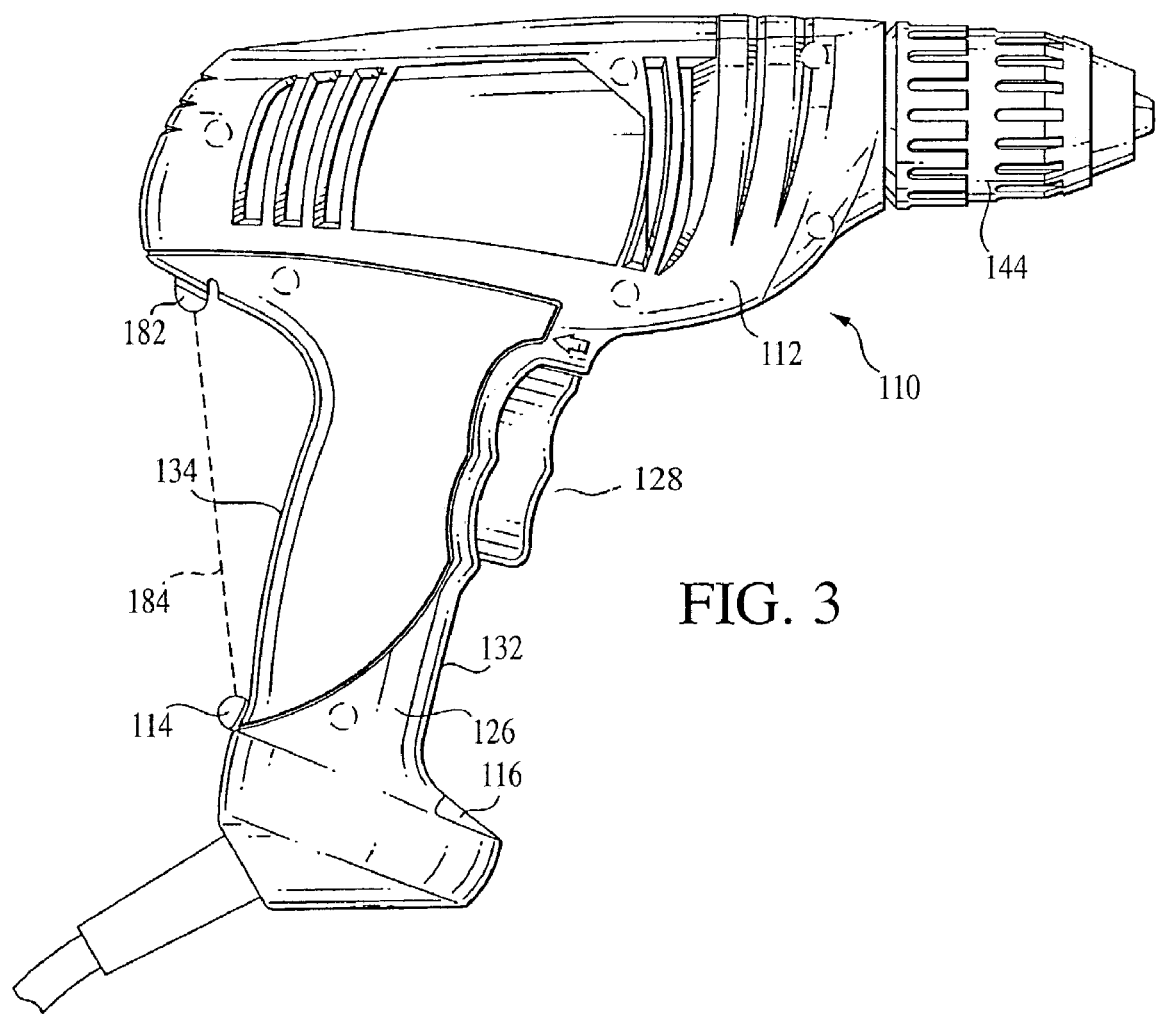
FIG. 3 is a side plan view of a second embodiment of the invention having an IR emitter.
Figure 4:
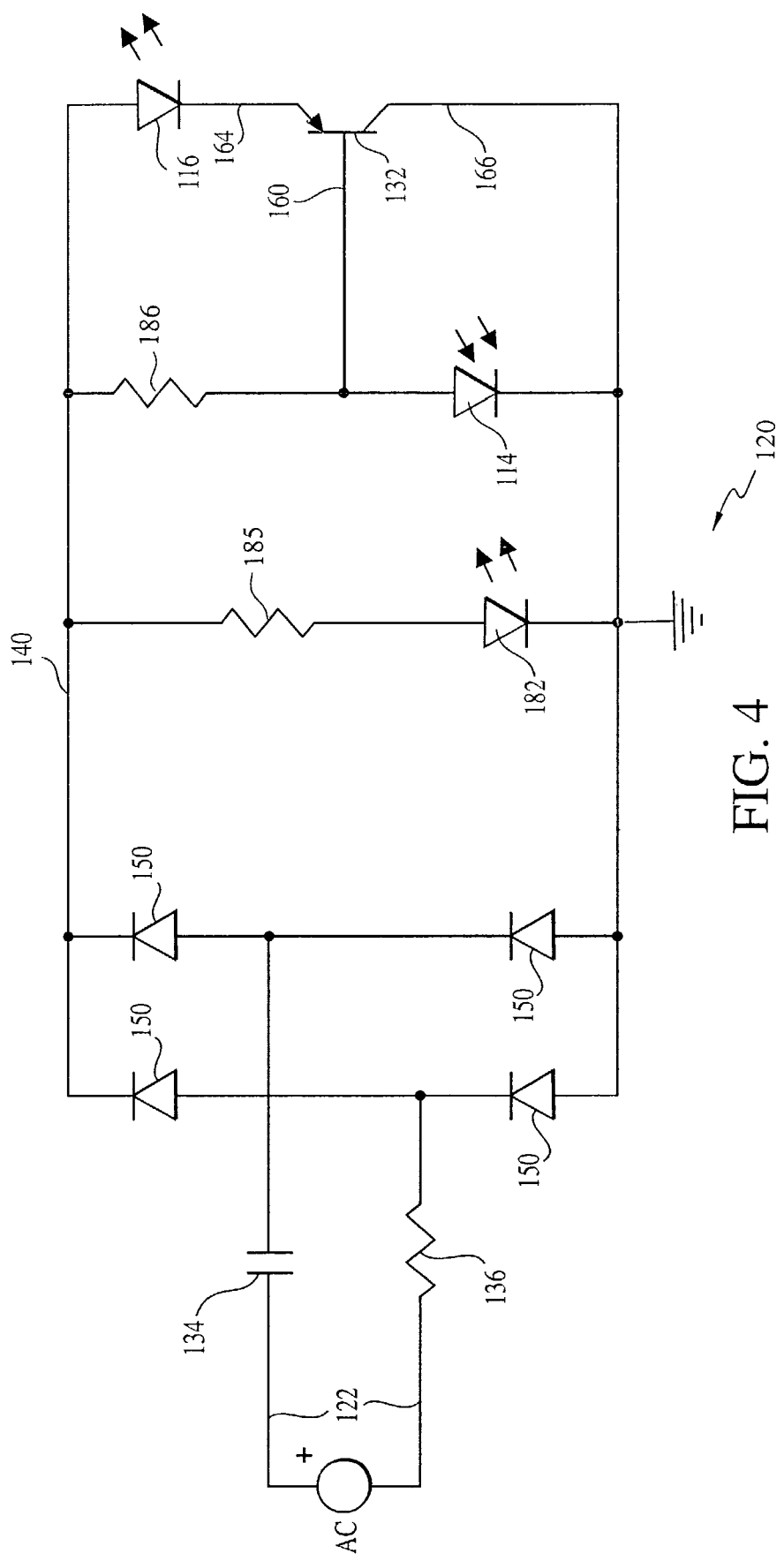
FIG. 4 is a schematic diagram of a preferred trigger circuit for the tool of FIG. 3.

When the detector 14 is an infrared (IR) sensor, two types are optionally used. IR sensors 14 that detect the warmth of the hand are used in essentially the same manner as that shown in FIGS. 1 & 2. However, FIGS. 3 & 4 show a second embodiment 110 which require the presence of an IR emitter 182. In this embodiment, the drill 110 includes a housing 112 having a detector 114 and a light 116 disposed therein, and a handle 126, trigger switch 128 and chuck 144 are provided, as in the embodiment of FIG. 1. A trigger circuit, designated generally at 120 in FIG. 4, is located within the housing and is connected to the detector 114, the light 116 and an AC power source via lines 122. Lines 122 are connected via capacitor 134 and resistor 136 to a diode bridge comprised of diodes 150, similar to FIG. 2. The cathodes of the top two diodes 150 are connected to light 116 via line 140, and light 116 is connected by line 164 to the emitter of transistor 132, the collector of which is connected to ground 166. Line 140 is connected to resistor 186 which is in turn connected to the base of transistor 132 and to detector 114 by line 160. The presence of the operator's hand is detected by interruption of an IR beam 184 between the emitter and a detector 114. The IR emitter 182 and the detector 114 are suitably placed anywhere on the housing 112 that causes interruption of the IR beam 184 when the hand is placed in the normal position to operate the tool 110. If the detector 114 is placed on the back 134 of the handle 126, the IR emitter 182 can be located on the housing at the back of the tool 110 as shown in FIG. 3. When the detector 114 is located on the front of the handle 126, a suitable location for the IR emitter 182 is on the front of the housing 112, near the chuck 144. The trigger circuit 120 is modified as shown in FIG. 4 to provide constant power to the IR emitter 182. A resistor 185 optionally adjusts the voltage to the IR emitter 182.

The trigger circuit 20 is also useful to terminate operation of the tool itself in conjunction with the light 16. This lockout functionality terminates power to the drill 10 if the operator' hand is not detected by the sensor 14, preventing uncontrolled operation of the tool if the drill 10 is dropped or the operator is incapacitated. Although the release of the trigger 26 should cease operation of the tool 14, the power lockout feature would serve as a backup safety feature if the trigger switch failed to cut power for any reason.

While many types of controlled switch components can be used, a relay is preferred. Referring to FIG. 2, a relay 76 that functions to interrupt power to the tool motor is preferably located in the housing and is controlled by a relay coil 78 that is in series with the light 16 so that it is activated and deactivated with the light 16 essentially simultaneously. While the coil 78 is in series as shown, it can be connected in parallel with the light 16, depending on the relative loads of each device. Normally, when the operator sets down the drill 10, there is no immediate need for either light or power until the tool is picked up again for the next use. Automatic deactivation of the light and power is not an inconvenience. However, in the case where the drill 10 is accidentally dropped, failure of the sensor 14 to detect the operator's hand automatically terminates power to the drill 10.

Figure 5:
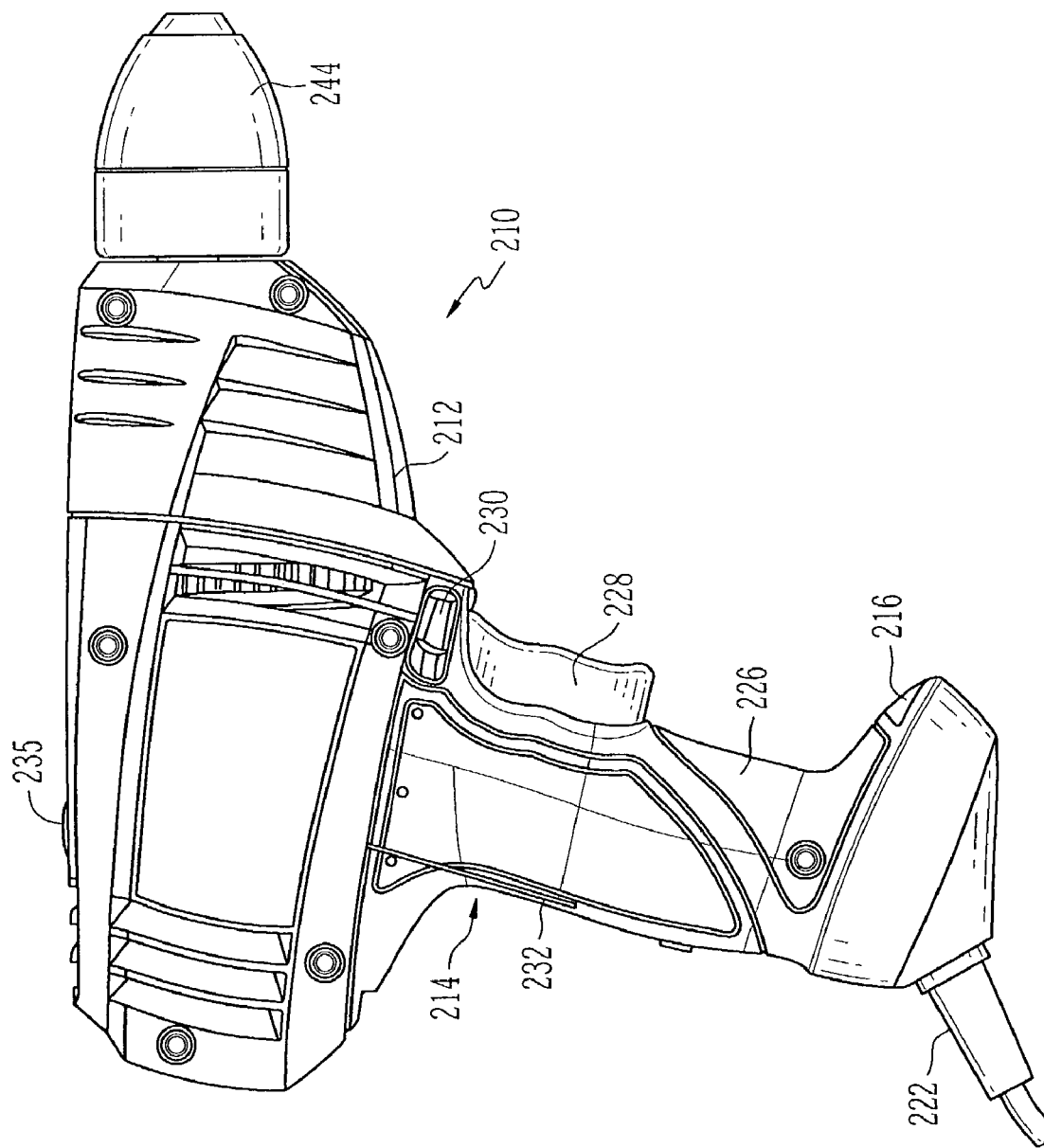
FIG. 5 is a side plan view of a third embodiment of the present invention.

A third embodiment of the present invention is illustrated in FIGS. 5-8, and comprises a capacitive sensor located in the housing of the tool that controls the activation of a light when a user is in close proximity to the tool, such as when the user grasps the tool, which in this illustrated embodiment is also a power hand drill. It should be understood that the drill may be an AC powered drill, such as those shown in FIGS. 1 and 3, or it may be a drill or other tool that can be powered by a battery pack and/or an AC power source. The drill illustrated in FIG. 5 is indicated generally at 210 and has a housing 212 and a tool chuck 244 at its forward end, with the housing having a handle 226 in which a trigger power switch 228 is located for operating the drill motor.

The drill 210 is shown to have an electrical cord 222 that is adapted to be plugged into an AC power supply and is therefore similar to the embodiment shown in FIGS. 1 and 3. It should also be understood that the power tool 210 could be of a type which has an enlarged end portion of the handle that is configured for receiving a battery pack and the drill itself may be therefore capable of operating with DC as well as AC power. It should be understood that while a drill is specifically illustrated in this embodiment, other types of hand tools may similarly be implemented with a capacitor sensor and to control the operation of a light 216 for illuminating the area that is being engaged by a tool during operation. The embodiment of FIG. 5 also has an operating mode switch mechanism, indicated generally at 230, which in this embodiment, controls the direction of rotation of the motor and chuck 244 to alternatively drill a hole in a workpiece and change the direction to back the drill out of the hole that was drilled.

Figure 7:
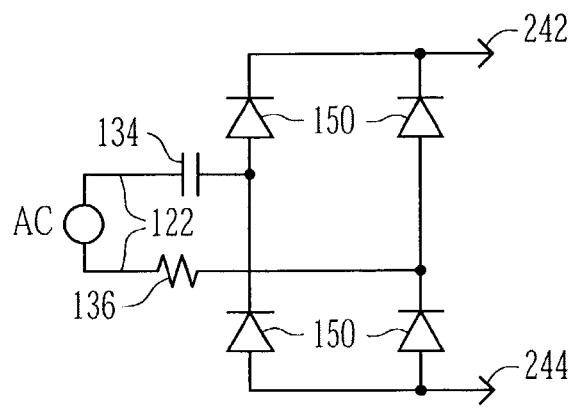
FIG. 7 is a schematic diagram of circuitry for a modification of the third embodiment.
Figure 8:
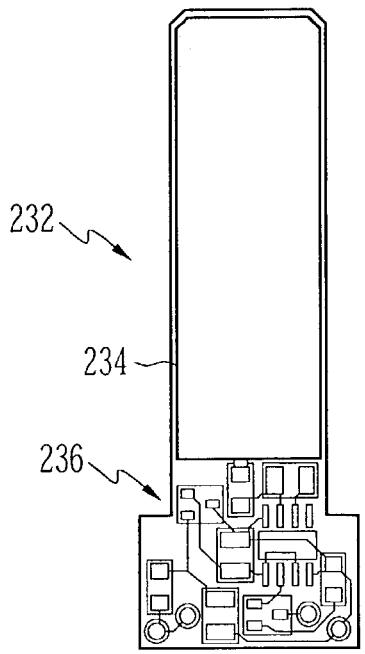
FIG. 8 is a plan view of a printed circuit board that comprises part of the third embodiment of the present invention.

The embodiment of FIG. 5 is designed to employ a touch sensor, indicated generally at 214, which is preferably a self-contained digital integrated circuit that is capable of detecting near proximity or touch. As shown in FIG. 8 the detector 214 preferably comprises a printed circuit board 232 that has a plate portion 234 that is connected to circuitry, indicated generally at 236, which is also shown in the electrical schematic diagrams of FIGS. 6 and 7, albeit for two alternatives of this embodiment of the present invention. The printed circuit board 232 is preferably approximately 1-½ to 2 inches in length, and is contained in the housing 212 of the drill, preferably in the position as shown that is inside the housing near the upper portion of the rear of the handle 226 in position to sense the hand of a user when the user is close to or grips the tool.

An advantage of this embodiment is that all of the sensing circuitry is safely located within the housing itself and is therefore not exposed to the elements. Preferably when a user grips the tool the detector 214 will sense the presence of the user's hand and immediately turn on the work illuminating light 216. Additionally, this embodiment preferably has an indicator 235 that provides a visual indication of the mode of operation of a tool, in this instance the direction of rotation of the motor once it is powered on by the user squeezing the trigger power switch 228. While this visual indication may be implemented in many different ways, it is preferred that one or more light emitting diodes be employed which either provide a directional indication in the form of an arrow indicating the direction the chuck 244 will rotate when the drill is powered on or it can be a visual indication that changes color depending upon the direction that the drill is switched to rotate. It is contemplated that alternative light emitting diodes be employed, such that a green LED would be illuminated for clockwise rotation and a red one illuminated for a counterclockwise rotation. Also, rather than two distinct light emitting diodes, light emitting diode structures are available which have three leads and which are packaged in a single structure which similarly provide different colored displays depending upon the position of the switch 230. It should also be appreciated that other types of lamps or other light emitting devices may be employed as desired.

Figure 6:
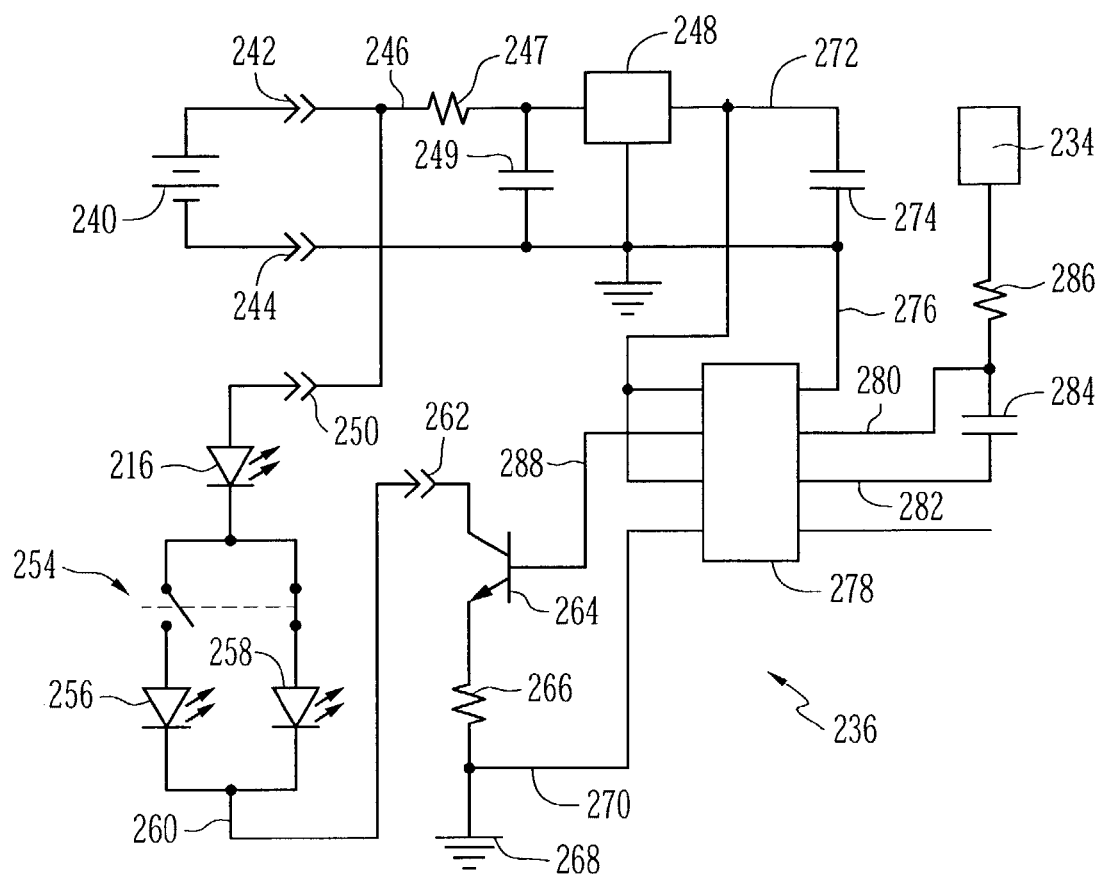
FIG. 6 is a schematic diagram of circuitry for the third embodiment of FIG. 5

Turning now to the circuitry that is utilized in this embodiment of the present invention and referring to FIG. 6, power is supplied to the circuitry by a battery 240 that is connected to the remainder of the circuitry by jacks 242 and 244. It should be understood that in the event that a power pack battery 240 is not employed, DC power could be applied to the jacks 242 by circuitry shown in FIG. 7 which is identical to that shown in the left portion of FIG. 4. The operation is therefore the same as has been previously described with regard to the second embodiment shown and described in FIGS. 3 and 4. Jack 242 is connected via line 246 to a resistor 247 and then to a voltage regulator 248 and a capacitor 249, with line 246 also connecting to a jack 250 and work illuminating LED 216. The cathode of the diode 216 is connected through a switch 254 to mode indicating LED's 256 and 258, both of which have their cathodes connected together by line 260 that extends to jack 262 and then to the collector of a NPN transistor 264, the emitter of which is connected to resistor 266 and then to ground 268 via line 270.

The voltage regulator 248 has an output on line 272 that extends to a capacitor 274 that in turn is connected by line 276 to ground and to an integrated circuit 278, which is a self-contained digital integrated circuit that comprises a charge-transfer touch sensor that is capable of detecting near proximity or touch. While other integrated circuits may be utilized that provide the same functionality, the integrated circuit 278 is preferably a charge-transfer touch sensor manufactured and sold by the Quantum Research Group as the QProX™ product having product number QT11H. Operating voltage is provided to integrated circuit 278 via line 272 and the integrated circuit 278 has input lines 280 and 282 which are respectively connected to opposite sides of a capacitor 284, with line 280 being connected through resistor 286 to the plate 236. The output line 288 extends to the base of the transistor 264.

The switch 254 is configured to alternately energize one of the LED's 256 and 258 when the detecting circuit detects the presence of a user's hand. The position of the switch 254 is either mechanically linked to the switch mechanism 230, or a small magnet may be placed on the switch mechanism 230 with the magnet being in close proximity to a reed switch so that actuation of the switch 230 will result in illumination of one or the other of the LED's 256 and 258 when a user is detected.

The sensitivity of the circuit can be tuned by varying the area of the plate 236 as well as the value of the capacitor 284. The resistor 286 serves to suppress electrical noise to the input 280 of the integrated circuit 276. A filter consisting of resistor 247 and the capacitor 249 suppresses noise to the voltage regulator 248 which then provides a relatively clean output on line 272 to the integrated circuit 272. The capacitor 274 effectively decouples the integrated circuit 276.

As earlier indicated, when a user is in proximity to the sensor plate 236, capacitance is changed and is applied via line 280 to the integrated circuit which will provide a positive output on line 288 to switch on the transistor 264 when the capacitance value reaches a predetermined threshold. This provides a path to ground through the resistor 266 that brings the cathode of both LED's 256 and 258 low. Voltage applied from the battery or the circuit of FIG. 7 is present on line 246 that turns on the light emitting diode 216 and switches it into conduction which in turn will switch on one or the other of the diodes 256 and 258 to correctly determine the direction of flow as previously described.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

What is claimed is:

1. A hand tool having a housing containing a motor powered by a power source and an operating power switch for the motor controllable by a user, the hand tool being operable in at least two different operating modes by manipulating an operating control switch, comprising:
    a proximity detector disposed in said housing for detecting at least the near proximity of an operator relative to the tool independently of the operation of the hand tool motor;
    a work illuminating light located in the housing;
    a mode indicating light located in the housing;
    a circuit located within the housing connected to said detector, said work illuminating light, said mode indicating light and the power source, said circuit energizing said work illuminating light and said mode indicating light when said detector detects the presence of the operator.

2. A hand tool as defined in claim 1 wherein said proximity detector comprises a charge-transfer touch sensor that measures capacitance levels applied to an input thereof and generates an output signal in response to the measured capacitance values exceeding a predetermined level.

3. A hand tool having a housing containing a motor powered by a power source and an operating power switch for the motor controllable by a user, the hand tool being operable in at least two different operating modes by manipulating an operating control switch, comprising:
    a proximity detector disposed in said housing for detecting at least the near proximity of an operator relative to the tool independently of the operation of the hand tool motor, and comprises a charge-transfer touch sensor that measures capacitance levels applied to an input thereof and generates an output signal in response to the measured capacitance values exceeding a predetermined level;
    a work illuminating light located in the housing;
    a mode indicating light located in the housing;
    a circuit located within the housing connected to said detector, said work illuminating light, said mode indicating light and the power source, said circuit energizing said work illuminating light and said mode indicating light when said detector detects at least the near proximity of the operator;
    wherein said sensor is mounted on a printed circuit board that includes an electrically conductive plate that is electrically connected to said sensor input, said printed circuit board being contained within the housing.

4. A hand tool as defined in claim 1 wherein said work illuminating light comprises a light emitting diode.

5. A hand tool as defined in claim 1 wherein said mode indicating light comprises at least one light emitting diode means that can emit light having at least two colors.

6. A hand tool as defined in claim 1 wherein said mode indicating light comprises two light emitting diodes, illumination of one of which indicates a first mode of operation and illumination of the other of which indicates a second mode of operation.

7. A hand tool as defined in claim 6 wherein said first and second modes of operation comprising operating the motor of the tool in clockwise and counterclockwise directions.

8. A hand tool as defined in claim 1 wherein the power source is one of a battery or an AC source.

9. A portable handheld drill having a motor powered by a power source and an operating switch controllable by an operator, the drill having a housing with a main portion and an integral handle extending downwardly from the main portion, the drill having a chuck at the front of the main portion of the housing for holding a tool and a direction control switch for reversing the direction of rotation of the motor, the operating switch being in the upper front portion of said handle, the drill comprising:
    a proximity detector disposed in the housing for detecting at least the near proximity of an operator's hand relative to the tool independently of the operation of the hand tool motor;
    a first light located in said housing;
    at least one second light;
    a direction sensing means for providing a direction signal indicating the direction of rotation of the motor;
    a circuit located within said housing connected to said detector, said first light, said second light and the power source, said circuit energizing said first light when said detector detects the presence of the operator.

10. A handheld drill as defined in claim 9 wherein said proximity detector comprises a charge-transfer touch sensor that measures capacitance levels applied to an input thereof and generates an output signal in response to the measured capacitance values exceeding a predetermined level.

11. A handheld drill as defined in claim 10 wherein said sensor is mounted on a printed circuit board that includes an electrically conductive plate that is electrically connected to said sensor input, said printed circuit board being contained within the housing.

12. A handheld drill as defined in claim 9 wherein said first light comprises a light emitting diode.

13. A handheld drill as defined in claim 9 wherein said second light comprises at least one light emitting diode means that can emit light having at least two colors.

14. A handheld drill as defined in claim 9 wherein said second light comprises two light emitting diodes, illumination of one of which indicates a first rotational direction and illumination of the other of which indicates a second rotational direction.

* * * * *